(12) United States Patent
Barraud et al.

(10) Patent No.: US 9,876,121 B2
(45) Date of Patent: Jan. 23, 2018

(54) METHOD FOR MAKING A TRANSISTOR IN A STACK OF SUPERIMPOSED SEMICONDUCTOR LAYERS

(71) Applicant: Commissariat a l'energie atomique et aux energies alternatives, Paris (FR)

(72) Inventors: Sylvain Barraud, Le Grand Lemps (FR); Shay Reboh, Sassenage (FR); Maud Vinet, Claix (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 15/070,781

(22) Filed: Mar. 15, 2016

(65) Prior Publication Data
US 2016/0276494 A1 Sep. 22, 2016

(30) Foreign Application Priority Data
Mar. 16, 2015 (FR) ...................... 15 52111

(51) Int. Cl.
*H01L 29/786* (2006.01)
*H01L 29/06* (2006.01)
(Continued)

(52) U.S. Cl.
CPC ........ *H01L 29/78696* (2013.01); *B82Y 10/00* (2013.01); *H01L 21/02532* (2013.01);
(Continued)

(58) Field of Classification Search
CPC .................. H01L 29/0673; H01L 29/42392
See application file for complete search history.

(56) References Cited

U.S. PATENT DOCUMENTS 8,679,902 B1 3/2014 Basker et al.
2008/0135949 A1 6/2008 Lo et al.
(Continued)

FOREIGN PATENT DOCUMENTS

EP 2 654 083 A1 10/2013
FR 2 995 134 3/2014
(Continued)

OTHER PUBLICATIONS

J. J. Gu, et al., "III-V Gate-all-around Nanowire MOSFET Process Technology: From 3D to 4D", IEEE, 2012, 4 pgs.
(Continued)

*Primary Examiner* — Yu-Hsi D Sun
(74) *Attorney, Agent, or Firm* — Oblon, McClelland, Maier & Neustadt, L.L.P.

(57) ABSTRACT

A method for making a transistor in which:
a) on a substrate, at least one semi-conductor structure is made, which is formed by a stack comprising alternating layer(s) based on at least one first semi-conductor material and layer(s) based on at least one second semi-conductor material different from the first semi-conductor material,
b) a zone of the structure is made amorphous using implantations, the zone made amorphous comprising one or more portions of one or more layers based on the second semi-conductor material,
c) the portions are removed by selectively etching a second semi-conductor material made amorphous towards the first semi-conductor material (FIG. 2L).

15 Claims, 9 Drawing Sheets

(51) Int. Cl.

| | | |
|---|---|---|
| H01L 29/423 | (2006.01) | |
| H01L 29/66 | (2006.01) | |
| H01L 21/02 | (2006.01) | |
| H01L 21/266 | (2006.01) | |
| H01L 21/324 | (2006.01) | |
| H01L 29/775 | (2006.01) | |
| B82Y 10/00 | (2011.01) | |

(52) U.S. Cl.
CPC ...... *H01L 21/02667* (2013.01); *H01L 21/266* (2013.01); *H01L 21/324* (2013.01); *H01L 29/0673* (2013.01); *H01L 29/42392* (2013.01); *H01L 29/66439* (2013.01); *H01L 29/66545* (2013.01); *H01L 29/66742* (2013.01); *H01L 29/66772* (2013.01); *H01L 29/775* (2013.01); *H01L 29/78654* (2013.01)

(56) References Cited

U.S. PATENT DOCUMENTS

2012/0309172 A1* 12/2012 Romano .......... H01L 21/02002 438/478
2013/0302955 A1 11/2013 Vinet et al.

FOREIGN PATENT DOCUMENTS

| WO | WO 2006/038164 A1 | 4/2006 |
|---|---|---|
| WO | WO 2009/098548 A1 | 8/2009 |

OTHER PUBLICATIONS

U.S. Appl. No. 14/445,228, filed Jul. 29, 2014, 2015/0056734 A1, Feb. 2015, Laurent Grenouillet, et al.
U.S. Appl. No. 14/450,385, filed Aug. 4, 2014, 2015/0044841 A1, Feb. 2015, Perrine Batude, et al.
U.S. Appl. No. 14/555,897, filed Nov. 28, 2014, 2015/0155170 A1, Jun. 2015, Shay Reboh, et al.
U.S. Appl. No. 14/575,329, filed Dec. 18, 2014, 2015/0179474 A1, Jun. 2015, Sylvain Maitrejean, et al.
U.S. Appl. No. 14/579,069, filed Dec. 22, 2014, 2015/0179665 A1, Jun. 2015, Shay Reboh, et al.
U.S. Appl. No. 14/581,029, filed Dec. 23, 2014, 2015/0194489 A1, Jul. 2015, Sylvain Barraud, et al.
U.S. Appl. No. 14/425,977, filed Jul. 8, 2015, 2015/0340275 A1, Nov. 2015, Maud Vinet, et al.
U.S. Appl. No. 14/425,891, filed Mar. 24, 2015, 2015/0294903 A1, Oct. 2015, Laurent Grenouillet, et al.
U.S. Appl. No. 14/441,354, filed May 7, 2015, 2015/0294904 A1, Oct. 2015, Maud Vinet, et al.
U.S. Appl. No. 14/791,713, filed Jul. 6, 2015, 2016/0005862 A1, Jan. 2016, Shay Reboh, et al.
U.S. Appl. No. 14/802,283, filed Jul. 17, 2015, 2016/0020153 A1, Jan. 2016, Perrine Batude, et al.
U.S. Appl. No. 14/782,190, filed Oct. 2, 2015, 20160035843 A1, Feb. 2016, Maud Vinet, et al.
U.S. Appl. No. 14/950,416, filed Nov. 24, 2015, Shay Reboh, et al.
U.S. Appl. No. 14/950,833, filed Nov. 24, 2015, Shay Reboh, et al.
U.S. Appl. No. 14/982,852, filed Dec. 29, 2015, Sylvain Barraud, et al.
U.S. Appl. No. 14/993,598, filed Jan. 12, 2016, Bernard Previtali, et al.
French Preliminary Search Report dated Jan. 11, 2016 in French Application 15 5211 1 filed on Mar. 16, 2015 (with English Translation of Categories of Cited Documents).
D.J. Godbey, et al., "Selective Removal of $Si_{1-x}Ge_x$ from (100) Si Using $HNO_3$ and HF", Journal of the Electrochemical Society, vol. 139, (10), 1992, 5 pgs.
M. Vos, et al., "Selective amorphization of ion-bombarded SiGe strained-layer superlattices", Applied Pysics Letters, vol. 58, (9), 1991, 3 pgs.
T. W. Simpson, et al., "Amorphization threshold in Si-implanted strained SiGe alloy layers", MRS Proceedings, vol. 373, 1994, 9 pgs.

* cited by examiner

METHOD FOR MAKING A TRANSISTOR IN A STACK OF SUPERIMPOSED SEMICONDUCTOR LAYERS

TECHNICAL FIELD

The present invention relates to the field of micro-electronics and more particularly to that of transistors, and is concerned with making a transistor formed in a stack of superimposed semi-conductor layers.

It is applicable to making a transistor provided with a channel semi-conductor region including a plurality of semi-conductor elements distributed on several levels, these semi-conductor elements being possibly in the form of nanowires, or rods, or membranes.

More particularly, it allows for an improved implementation of a transistor provided with such a channel region and a coating gate provided around the semi-conductor elements.

PRIOR ART

Making a transistor, the channel structure of which is formed by a plurality of nanowires distributed on several levels is known.

A method for manufacturing such a transistor can comprise forming a stack of semi-conductor layers comprising alternating Si-based layers and SiGe based layers.

Then, a selective removal of SiGe relative to Si is carried out in particular, so as to release the Si nanowires before depositing the transistor gate.

With such a method, to enable Si nanowires to be released while ensuring holding of the structure, restrictive design rules have generally to be applied.

Because of these design rules, the overall space of source and drain blocs is high and does not enable a high nanowire density to be implemented. On the other hand, a good positioning as well as a good definition of the gate pattern turn out to be difficult to achieve.

Another method for making a transistor with nanowires consists in forming the gate by a damascene type method.

During such a method, a cavity 2 is filled with a gate material after a step of releasing nanowires has been carried out, for example by selectively etching SiGe nanowires relative to Si nanowires 4.

One drawback of such an approach is that it is difficult to avoid a SiGe over-etching which can tend to reach regions 6 in which the source and drain of the transistor are provided.

Such an example of over-etching is illustrated in FIG. 1. This over-etching can result in an inaccurate and non-uniform arrangement of the gate that is made after in the cavity 2. This can generate in particular an increase in the stray capacitances.

More generally, there is a need for a new method for making a transistor formed in a stack of superimposed semi-conductor layers.

DISCLOSURE OF THE INVENTION

According to one aspect, the invention provides a method for making a transistor formed in a stack of superimposed semi-conductor layers, the method comprising the steps of:

a) providing on a substrate, at least one semi-conductor structure formed by a stack comprising alternating layer(s) based on at least one first semi-conductor material and layer(s) based on at least one second semi-conductor material different from the first semi-conductor material, b) making amorphous, using one or more ion implantations, at least one zone of the structure, the zone made amorphous comprising one or more portions of one or more layers based on the second semi-conductor material, c) removing the portions based on the second semi-conductor material made amorphous by selectively etching the second semi-conductor material in an amorphous form towards the first semi-conductor material.

A first embodiment provides that the zone made amorphous in step b) is located in a centre region of the structure in which a channel region of the transistor is able to be formed.

In this case, the method can further comprise, after step a) and prior to step b), forming a masking on the stack, the masking comprising an aperture revealing a centre region of the structure, the amorphization implantation(s) being then made through the aperture of the masking, such that the zone made amorphous is located in the aperture whereas the crystal structure of parts of the layer(s) based on the second semi-conductor material which are protected by the masking and located outside the aperture is preserved.

The removal of the portions can then be performed in step c) by selectively etching the second semi-conductor material in an amorphous form towards the layers based on the first semi-conductor material and parts of the layer(s) based on the second semi-conductor material, the crystal structure of which has been preserved in step b).

Such a selective etching can enable an inopportune over-etching of the structure to be avoided.

Then, a gate can be formed in the aperture in which the amorphization has been made.

Advantageously, this aperture can be an aperture of a masking made beforehand in the step b), by:

forming a sacrificial gate arranged on the centre region, and then forming a masking layer against the sacrificial gate so as to form the masking, forming the aperture in the masking by removing the sacrificial gate.

An accurate aligning of the gate can thus be achieved.

According to a first possible implementation, the amorphization in step b) can be a selective amorphization of the portions based on the second semi-conductor material towards the layers based on the first semi-conductor material, and in particular of portions of the layers based on the first semi-conductor material which are located in the aperture.

To allow such a selective amorphization, the implementation parameters are adapted and the first semi-conductor material and the second semi-conductor material are suitably chosen.

The first semi-conductor material can in particular be based on Si or $Si_{1-x}Ge_x$ (with x>0), whereas the second semi-conductor material is based on $Si_{1-y}Ge_y$ with x<y. The amorphization selectivity can be adapted by modulating the germanium concentration difference between the first semi-conductor material and the second semi-conductor material.

The selective amorphization can be made through several implantations at different depths of the structure.

According to a second possible implementation, the amorphization in step b) can be a partial amorphization of the centre region of the structure so as to make amorphous one or more portions of one or more layers based on the second semi-conductor material as well as one or more portions of given layers based on the first semi-conductor material which are located in the aperture while preserving the crystal structure of at least one layer based on the first semi-conductor material also revealed by the aperture.

After removing the portions of the second semi-conductor material made amorphous in step c), at least one step of recrystallization thermal annealing can be carried out. Thus, the portions of given layers based on the first semi-conductor material can be recrystallized.

A second embodiment provides that the zone made amorphous in step b) is located in regions of the structure in which source and drain regions of the transistor are able to be formed, the implantation(s) being made in step b) so as to preserve the crystal structure of a centre region of the structure in which a channel region of the transistor is able to be made.

In this case, a removal of the portions based on the second semi-conductor material in an amorphous form is then carried out by selectively etching the second semi-conductor material in an amorphous form towards the layers based on the first semi-conductor material and parts of the layer(s) based on the second semi-conductor material located in the centre region and the crystal structure of which has been preserved.

The removal of the portions based on the second semi-conductor material in an amorphous form can result in forming empty spaces.

The method can then further comprise steps of:
depositing a given material in the empty spaces, the given material being a material chosen such that the second semi-conductor material in an amorphous form is able to be selectively etched towards the given material.
forming a masking provided with an aperture revealing the centre region of the structure,
removing parts based on the second semi-conductor material in the aperture by selectively etching the second semi-conductor material towards the first semi-conductor material and the given material.

The given material can advantageously be an insulating material.

Such a selective etching can enable an inopportune over-etching of the structure to be avoided.

In step b), a sacrificial gate can be provided on the centre region of the structure. In this case, the method can further comprise forming a masking layer against the sacrificial gate so as to form a masking, and then removing the sacrificial gate to form an aperture in the masking.

It is then through this aperture that step c) of removing parts based on the second semi-conductor material can be made.

A gate can then be deposited into the aperture after step c).

The method can further comprise after step c) at least one step of thermal annealing so as to recrystallize the layers based on the first semi-conductor material.

In either of the embodiments, the stack made can comprise alternating $Si_{1-x}Ge_x$ based layer(s) and $Si_{1-y}Ge_y$ based layers with $0 \leq x < y$.

This stack can advantageously be formed on a SOI- or SiGeOI-type substrate.

According to another aspect, the invention provides a method for making a transistor formed in a stack of superimposed semi-conductor layers, the method comprising the steps of:
providing on a substrate, at least one semi-conductor structure formed by a stack comprising alternating layer(s) based on at least one first semi-conductor material and layer(s) based on at least one second semi-conductor material different from the first semi-conductor material,
removing, in a centre region of the structure revealed by an aperture of a masking, portions based on the second semi-conductor material, the removal being carried out by:
selectively etching the second semi-conductor material made amorphous in the aperture towards the first semi-conductor material, or
selectively etching the second semi-conductor material towards the first semi-conductor material and a given material surrounding the second material outside the aperture and formed beforehand.

This given material can be formed by amorphization using one or more implantations of zones of the structure provided on either side of the centre region, and then etching in these zones the second semi-conductor material in an amorphous form and replacing the second semi-conductor material in an amorphous form with a given material.

This given material is chosen so as to be able to resist a selective etching of the second semi-conductor material.

The given material is advantageously an insulating material.

BRIEF DESCRIPTION OF THE DRAWINGS

The present invention will be better understood upon reading the description of exemplary embodiments given by way of purely indicating and in no way limiting purposes, making reference to the appended drawings in which.

Identical, similar or equivalent parts of the different figures bear the same reference numerals so as to facilitate switching from one figure to the other.

The different parts represented in the figures are not necessarily drawn to a uniform scale, to make the figures more legible.

Further, in the following description, terms which depend on the orientation, such as "on", "above", "upper", "lateral", etc. of a structure are applied considering that the structure is oriented in the way illustrated in the figures.

DETAILED DISCLOSURE OF PARTICULAR EMBODIMENTS

One exemplary method for making a transistor formed in a stack of superimposed semi-conductor layers will now be described in connection with FIGS. 2A-2O.

Figure 2A:
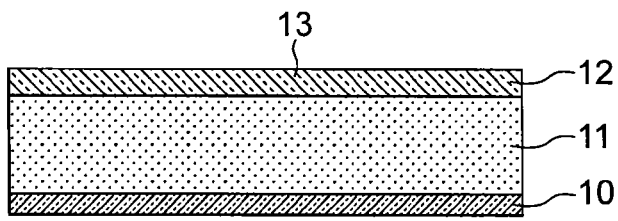
FIGS. 2A-2O illustrate a first exemplary method for making a transistor according to one embodiment of the present invention.
Figure 2B:
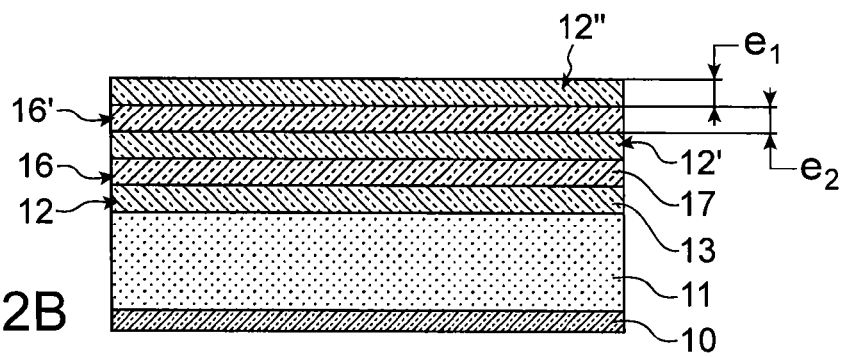

FIG. 2A illustrates a possible starting material for this exemplary embodiment in the form of a semi-conductor on insulator-type substrate, for example of the SOI type, which comprises a semi-conductor support layer, an insulating layer 11 which can be based on silicon oxide and is provided on and in contact with the support layer 10. The insulating layer 11 of the substrate can in particular be a BOX ("Buried Oxide") type layer based on an insulator such as $SiO_2$. A BOX layer with a thickness for example in the order of 145 nm can be provided.

The substrate also includes a semi-conductor layer 12 located on, and in contact with the insulating layer 11 of the substrate. The superficial semi-conductor layer 12 is based on a first crystal semi-conductor material 13. The first semi-conductor material 13 can be $Si_{1-x}Ge_x$ with x≥0. In this exemplary embodiment, the first semi-conductor material 13 can be silicon (x=0).

Several other semi-conductor layers are made on the superficial semi-conductor layer 12, for example by several successive epitaxies, and form with the same a semi-conductor stack. The semi-conductor stack can be formed by alternating one or more layers 12, 12', 12" based on the first semi-conductor material 13 and one or more layers 16, 16', based on a second semi-conductor material 17 different from said first semi-conductor material. The second semi-conductor material 17 can be based on $Si_{1-y}Ge_y$ with germanium concentration y different from that of the first crystal semi-conductor material 13 and y which can be for example higher than 20%.

A stack of at least two semi-conductor layers is provided. A stack with a number of 5 semi-conductor layers 12, 16, 12', 16', 12" is given by way of non-limiting example in FIG. 2C.

The layers 12, 12', 12" based on the first semi-conductor material 13 can have a thickness $e_1$ between for example 5 and 25 nanometers, for example in the order of 12 nm.

The layers 16, 16' based on the second semi-conductor material 17 can have a thickness $e_2$ between for example 5 and 25 nanometers, for example in the order of 12 nm.

Figure 2C:
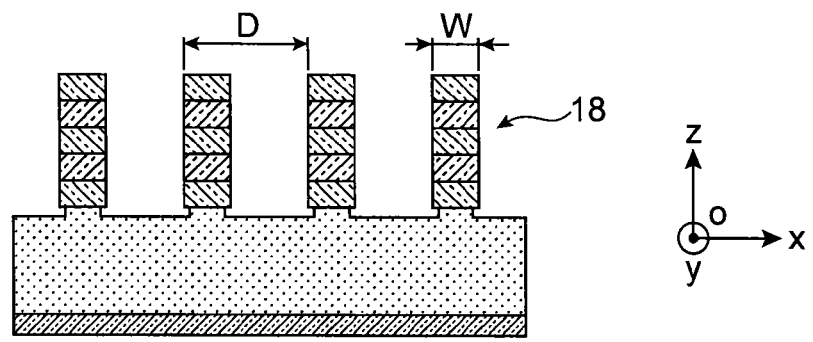

Once the stack is made, the layers 12, 12', 12", 16, 16' of the same are etched so as to make at least one structure 18 formed by superimposed semi-conductor elements based on the first semi-conductor material 13 and the second semi-conductor material 17. The semi-conductor elements can be, depending on their width W for example in the form of nanowires, or rods, or membranes. The width W of the semi-conductor elements can be for example between several nanometers and several tens of nm, for example in the order of 10 nm. In the example of FIG. 2C, W is measured in a direction parallel to the main plane of the substrate, the main plane of the substrate being a plane passing through the substrate and parallel to the plane [O; x; y] of an orthogonal reference frame [O; x; y; z].

The semi-conductor elements of this structure 18 can be provided to connect a first block and a second block intended to form respectively a source region and a drain region of the transistor. The source and drain regions are in this exemplary embodiment etched blocks of the structure 18 which are made simultaneously as the semi-conductor elements.

In the example of FIG. 2C, several juxtaposed structures 18 each formed by a stack of nanowires, or rods, or membranes are made.

The distance D between two juxtaposed structures 18 can be between for example 20 and 50 nanometers, for example in the order of 30 nm. To make the structure(s) 18, photolithography and etching techniques can be employed.

Then, on a centre region of the structures 18 of nanowires, a sacrificial gate 20 is formed.

Figure 2D:
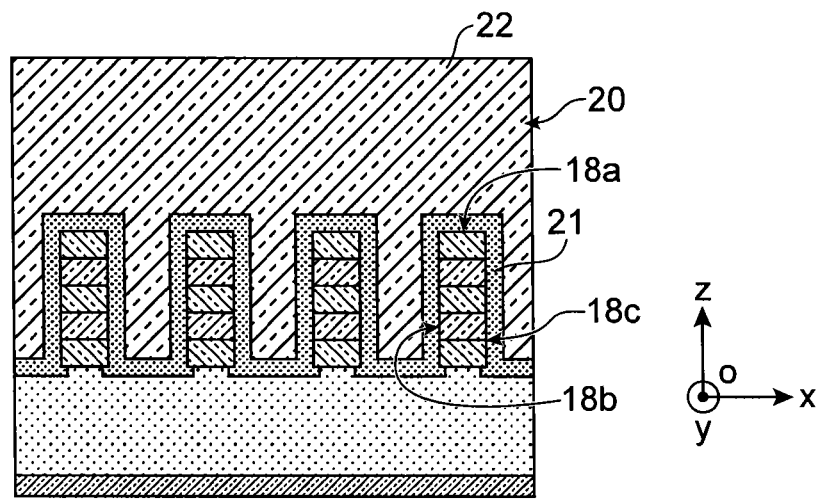

This sacrificial gate 20 covers an upper face 18a, in other words the top of the structures 18 as well as the side flanks 18b, 18c of the centre region of the structures 18 (FIG. 2D).

To form this gate 20, at least one gate dielectric 21 can be deposited, for example based on $SiO_2$, which is covered with at least one gate material layer 22 such as for example polysilicon. The gate dielectric 21 can have a thickness of several nanometers, for example between 2 and 6 nm. The gate material 22 can itself have a thickness of several tens of nanometers, for example between 50 and 200 nm. An etching of the dielectric 21 and the gate material 22 is then carried out through a masking, which can be in the form of a hard mask.

The hard mask can be for example based on silicon nitride and can have a thickness between several nm and one or more tens of nm, for example in the order of 40 nm.

Figure 2E:
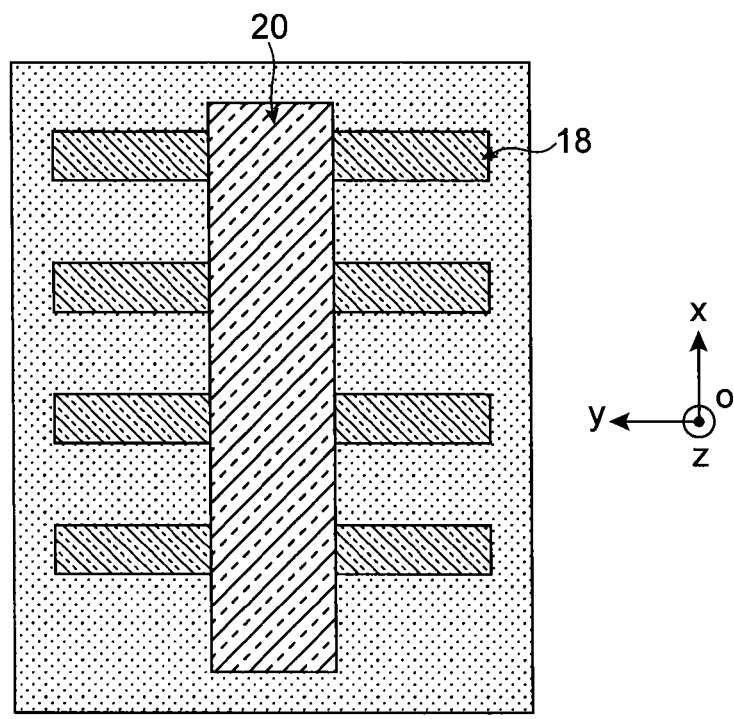

In FIG. 2E, the sacrificial gate 20 covering a centre region of the structures 18 is represented according to a top view, without the hard mask.

Then, insulating spacers 27 can be formed against the sacrificial gate 20 and the hard mask 25. The insulating spacers 27 can be made by depositing an insulating layer, for example based on silicon nitride (SiN, SiBCN for example, or $SiO_2$) up to the level of the hard mask 25 and then by etching this insulating layer.

Figure 2F:
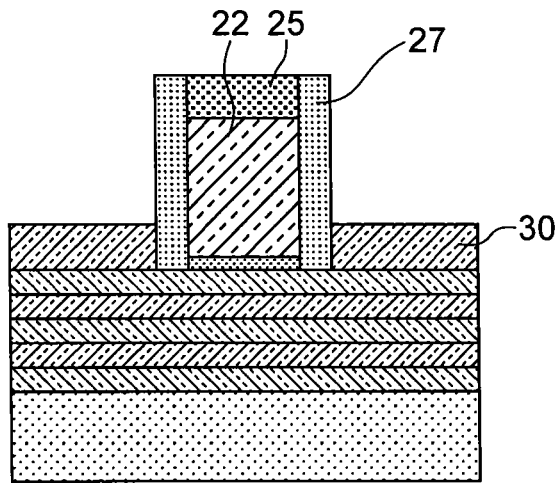

Then, a semi-conductor material 30 can be formed, in particular by epitaxy growth, on the source and drain blocks (FIG. 2F). The semi-conductor material 30 formed can be for example carbonaceous silicon SiC:P or silicon Si:P, in particular to implement a NMOS transistor. A doping of the semi-conductor material 30, for example with phosphorus (P) can be further carried out. This doping can be made in situ during the epitaxy. The semi-conductor material 30 covers an upper face of the source and drain regions and can also cover side faces (not shown in the transverse cross-section view of FIG. 2F) of the source and drain regions. To implement a PMOS transistor, silicon germanium doped with boron $Si_{1-x}Ge_x$:B (with, for example, x>0.2) could be used. The doping can also be made in situ during the epitaxy.

Then, a masking layer 40 is formed so as to cover the structures 18 and the hard mask 25. The masking layer 40 can be chosen based on a material adapted to be selectively etched towards that of the hard mask 25. This masking layer 40 can for example be based on silicon oxide.

Figure 2G:
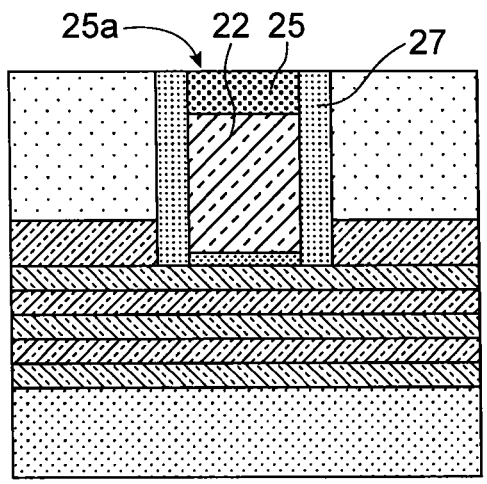
Figure 2H:
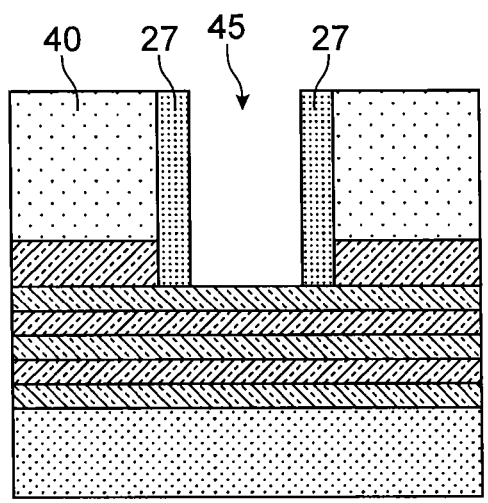

A step of removing, for example by chemical mechanical planarization or polishing (CMP), this masking layer 40 is then made with a stop at the top or the upper face 25a of the hard mask 25. The upper face 25a of the hard mask 25 is thus revealed at the end of this removal step (FIG. 2G).

Figure 2I:
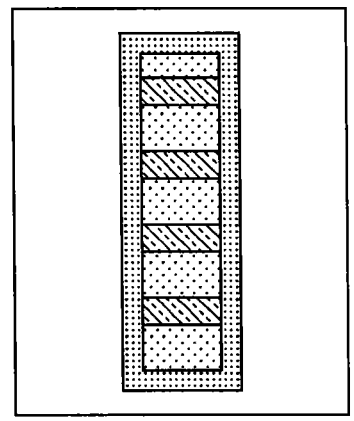

Then, the masking layer 40 is made by carrying out an aperture 45 by removing the hard mask 25 and the sacrificial gate 20. The aperture 45 can extend to the insulating layer 11 of the substrate and reveal the side faces 18b, 18c of the structures 18 at their centre region. The aperture 45 can have a constant cross-section and preserve the exact print of the sacrificial gate 20. The removal of the material 22 of the sacrificial gate 20 can for example be made by a wet etching using a TMAH (tetramethylammonium hydroxide) solution, when the material 22 is polySi. The dielectric 21 is then removed. Thus, in the aperture 45, a centre region of the structures 18 which is not covered with another material is obtained (FIG. 2I in which the device is represented in a top view).

Figure 2J:
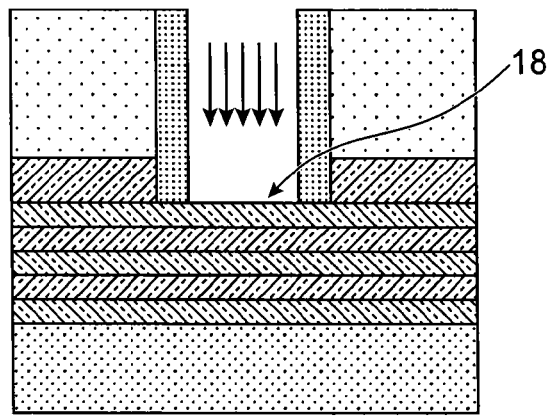
Figure 2K:
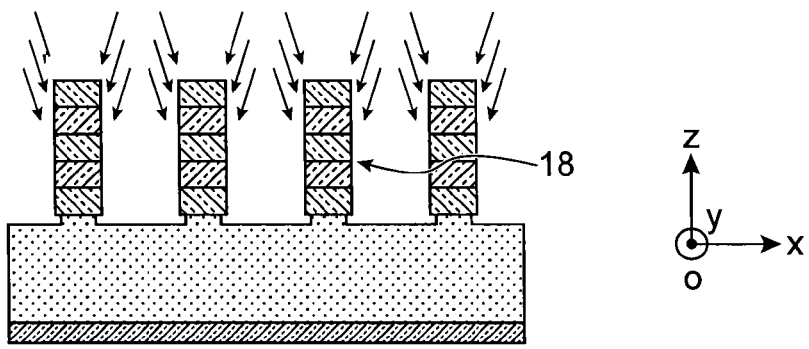

Then, an amorphization of at least one zone of the centre region of the structures 18 is carried out using one or more ion implantations (FIGS. 2J and 2K).

In this example, a selective amorphization of portions $16_1$, $16_1'$ of the layers 16, 16' based on the second semi-conductor material 17 which are revealed by the aperture 45 towards the portions $12_1$, $12_1'$, $12_1''$ of the layers 12, 12', 12" based on the second semi-conductor material 17 which are revealed by the aperture 45 is made.

Figure 2L:
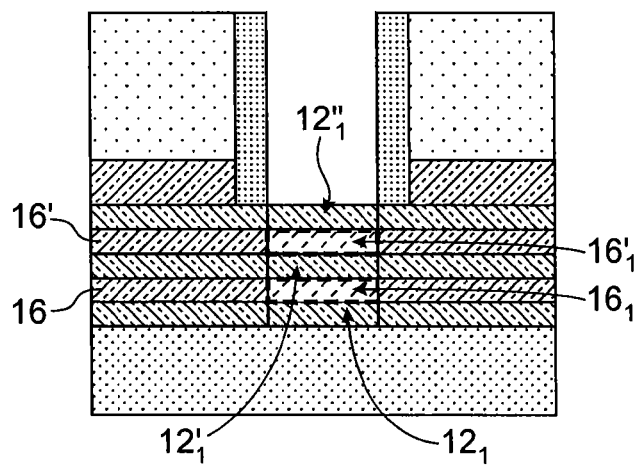

The parts $12_1$, $12_1'$, $12_1''$ are thus not made amorphous and preserve their crystal structure (FIG. 2L).

The amorphization selectivity can be due to the choice of the semi-conductor materials 13 and 17 as well as that of one or more of the implantation parameters which are dose, energy and implantation temperature.

The couple of semi-conductor materials 13 and 17 is preferably chosen such that the implantation dose required to make amorphous the second semi-conductor material 17 is lower than the dose required to make amorphous the first semi-conductor material 13.

An amorphization selectivity can in this example be achieved by virtue in particular to a Ge concentration difference between the first semi-conductor material 13 and the second semi-conductor material 17.

Thus, for a same given implantation dose and a same given temperature, only the layer 16 based on the second semi-conductor material 17 richer in Ge is amorphized.

This amorphization selectivity is for example described in document: *"Amorphization threshold in Si implanted strained SiGe alloy layers"*, by T. W. Simpson et al., EMRS 94, Boston.

In order to achieve a good amorphization selectivity, the y-x concentration difference between the first crystal semi-conductor material 13 and the second semi-conductor material 17 is preferably higher than or equal to 15%.

Those skilled in the art will be capable of obtaining experimental curves at a given Ge concentration difference, dose, energy and implantation temperature to achieve a selective amorphization.

With the dose and energy being set, the temperature at which the substrate is placed can in particular be adapted in order to modify the amorphization selectivity.

The above-mentioned document by Simpson gives for example temperature and dose windows to enable, for a given energy, $Si_{1-y}Ge_y$ with y=0.15 with respect to Si to be selectively amorphized or to enable, for a given energy, $Si_{1-y}Ge_y$ with y=0.29 with respect to Si to be selectively amorphized.

FIG. 6 of this document shows that by being above a first given implantation limit temperature by the abscissa of the curve "Si" and below a second given implantation limit temperature by the abscissa of the curve "15% Ge", $Si_{1-y}Ge_y$ with y=0.15 can be amorphized without amorphizing Si.

The species used to make amorphous the second crystal semi-conductor material 17 can be for example Si.

The implantation energy and the dose depend on the depth at which the portions $16_1$, $16'_1$ of the layers 16, 16' to be made amorphous are located.

In order to be able to make amorphous layers 16, 16' located at different heights of the structure 18, one or more implantations, made at different respective implantation energies and doses can be carried out.

In one embodiment, several implantations are made at different respective implantation energies, each energy being adapted so as to provide a maximum defects concentration at the portions $16_1$, $16'_1$ of the layers 16, 16' based on the second semi-conductor material 17. The amorphization of the different portions $16_1$, $16'_1$ of the layers based on the second semi-conductor material 17 can be made according to a sequence of implantations made from the highest to the lowest energy. The corresponding doses can be adapted for the different implantations, in view of the different implantation depths, and can take the dose accumulation provided by the sequential implantation into account.

For example, in order to make amorphous a layer of $Si_xGe_{1-x}$ with x=0.6, with a thickness in the order of 8 nm located at a depth in the order of 30 nm of a semi-conductor stack without making amorphous Si layers located respectively under and in contact, and on and in contact with the layer of $Si_xGe_{1-x}$, a Si implantation at an energy of 25 keV and a dose of $1.5 \times 10^{14}$ cm$^{-2}$ can be used.

According to one alternative, by adapting the dose-implantation energy couple, the amorphization can be made in a single ion implantation. Document "Selective amorphization of ion-bombarded SiGe strained-layer superlattices", by Vos et al., Applied Physics Letter 58(9), 1991 shows for example that layers of $Si_xGe_{1-x}$ can be selectively implanted in a stack of Si layers and $Si_xGe_{1-x}$ layers.

In this example, preserving the crystal structure of the portions $12_1$, $12_1'$, $12_1''$ based on the first semi-conductor material can enable in particular a subsequent recrystallization of these portions $12_1$, $12_1'$, $12_1''$ to be avoided. This subsequent recrystallization is likely to possibly generate defects in the semi-conductor material.

Figure 2M:
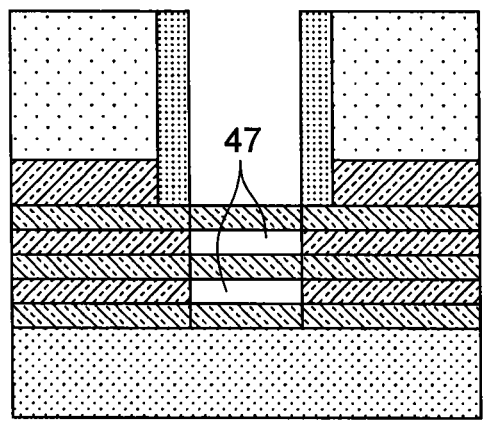

After the selective amorphization, a removal of the portions $16_1$, $16'_1$ from the layers 16, 16' based on the second semi-conductor material 17 located inside the aperture 45 is carried out (FIG. 2M).

This removal can be made by selectively etching portions $16_1$, $16'_1$ based on the second semi-conductor material 17 in an amorphous form towards the rest of the layers 16, 16' based on the second semi-conductor material 17 in a crystal form and the first semi-conductor material 13 (FIG. 2L). Suspended nanowires or rods or membranes based on the first semi-conductor material are thus released.

Such a selective etching can for example be made using a dry etching, for example using HCl, or HBr/He/$O_2$ or HBr/$Cl_2$ or $CF_4$/HBr/$Cl_2$ or a wet etching, for example using an acetic chemistry HF/$H_2O_2$, or Hot SC1. (SC1 for "Standard Clean 1"), SC1, diluted SC1, SC1 being a water/hydrogen peroxide ($H_2O_2$)/ammonia ($NH_4OH$), mixture; when the second material 17 is based on silicon germanium and when the first semi-conductor material 13 is Si.

Figure 1:
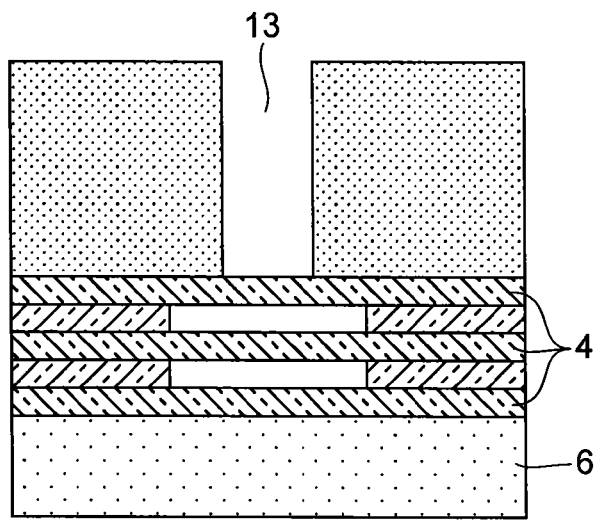
FIG. 1 illustrates a problem of over-etching likely to occur during a method for making a channel structure with nanowires implemented according to prior art.

Thus, in the aperture 45, suspended semi-conductor portions $12_1$, $12_1'$, $12_1'$ based on the first semi-conductor material are obtained. Empty spaces 47 are thus formed around these portions, in particular in the places where the portions $16_1$, $16'_1$ have been removed. Because of the etching selectivity between the amorphous portions $16_1$, $16'_1$ of the layers 16, 16' and the parts of these layers located outside the aperture and the crystal form of which has been preserved, the empty spaces 47 are accurately defined and an over-etching as illustrated in FIG. 1 is avoided.

Figure 2N:
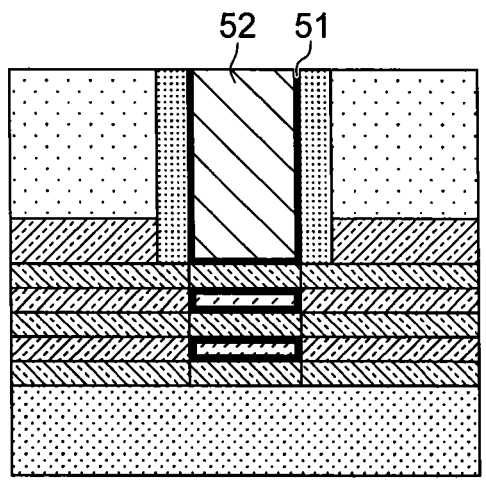
Figure 2O:
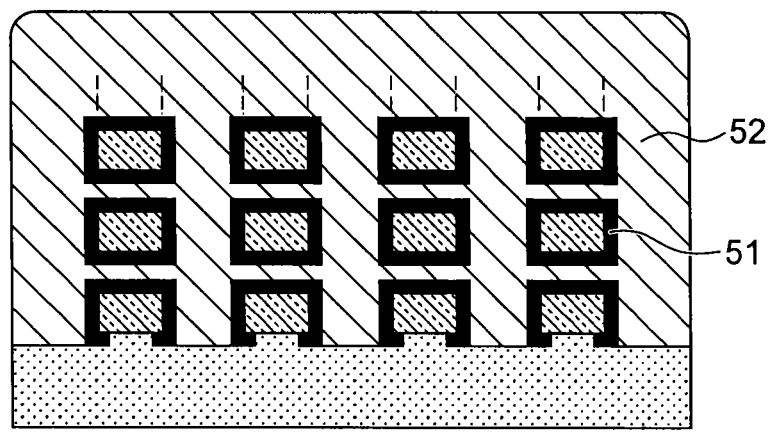

Then, a gate is formed in the aperture 45 (FIGS. 2N and 2O). The formation of this gate 50 can comprise depositing a gate dielectric 51 such as for example $HfO_2$, and then at least one gate material 52 which can be metal, for example based on TiN or formed by a stack of a metal material and a semi-conductor material such as polysilicon. Thus, the aperture 45 is filled and a coating gate 50 filling the empty spaces around the semi-conductor portions $12_1$, $12_1'$, $12_1''$ is formed. The gate 50 made can be of the GAA ("Gate All Around") type.

A step of removing the gate material projecting above the aperture 45 can then be made.

At the end of this step, a self-aligned gate, the dimensions of which are defined by those of the aperture 45, is made.

The transistor made in this example is thus provided with a channel semi-conductor structure formed by a plurality of semi-conductor elements, such as nanowires or rods or membranes, provided the one above the other and thus distributed on several levels, a coating gate being provided around these elements.

According to another exemplary embodiment, a method as previously described can be implemented from a stack formed by alternating a first semi-conductor material 13 based on $Si_{1-x}Ge_x$ with x for example such that $0 \leq x < 0.1$ and a second semi-conductor material 17 based on $Si_{1-y}Ge_y$ with y>x and y higher than 0.3, preferably such that y−x>0.15 advantageously such that y−x>0.5.

A selective amorphization by implantation of a $Si_{1-y}Ge_y$ layer with a Ge concentration y in the order of 30% using a dose for example in the order of $2\times10^{14}$ ions/cm$^2$ can then be made.

Another exemplary embodiment adapted in particular to implement a PFET type transistor can provide as a starting material a SiGeOI type substrate, in which the superficial semi-conductor layer 12 is based on $Si_{1-y}Ge_y$ with $y \geq 0$ and for example such that y=0.2.

In this case, the semi-conductor stack which is then made can be formed by alternating layers 12, 12', 12" based on $Si_{1-y}Ge_y$ and layers 16, 16' based on Si or $Si_{1-x}Ge_x$ with x>y (x=0.5 and y=0.2 for example).

Then, the same steps as in the exemplary method previously described are made. Portions of the layers 16, 16' are in particular selectively amorphized while preserving the crystal structure of the layers 12, 12', 12". Then, the amorphized portions of the layers 16, 16' are selectively etched. Thus, suspended nanowires or rods or membranes based on $Si_{1-y}Ge_y$ are formed.

According to an alternative exemplary method just described in connection with FIGS. 2A-2O, instead of the selective amorphization step of the centre region of the structure(s) 18 located in the aperture 45 previously described in connection with FIGS. 2J-2L, an amorphization of the entire centre region or advantageously of a zone Z of this centre region can be made while preserving the crystal structure of at least one semi-conductor layer 12 based on the first semi-conductor material 13.

Figure 3A:
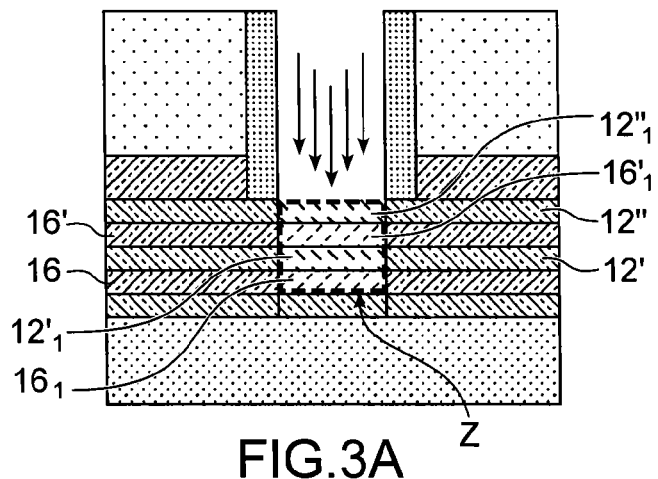
FIGS. 3A-3C illustrate a second exemplary method for making a transistor according to one embodiment of the present invention.

Thus, in the exemplary embodiment of FIG. 3A, an amorphization of portions $12_1''$, $12_1'$, of the layers 12'', 12', based on the first semi-conductor material 13 as well as an amorphization of portions $16_1'$, $16_1$, of the layers 16', 16, based on the second semi-conductor material 17 which are located in the aperture 45 are performed.

This amorphization can be made using an implantation provided in particular because of its dose and energy so as to preserve the crystal structure of a layer 12 based on the first semi-conductor material 13, in this example the lowest layer of the semi-conductor stack.

Figure 3B:
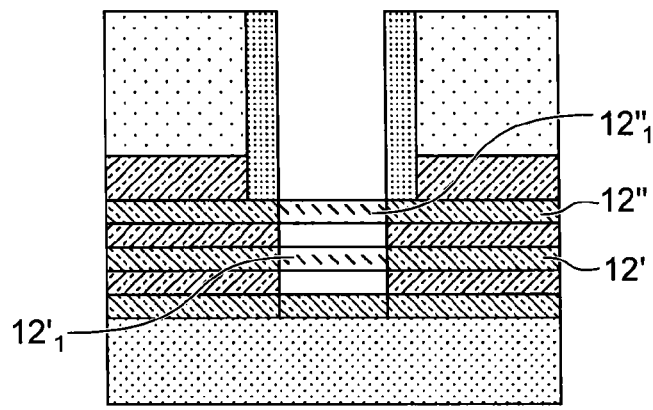

Then, the selective removal of the second material made amorphous (FIG. 3B) is performed (HCl, or HBr/He/O$_2$ or HBr/Cl$_2$ or CF$_4$/HBr/Cl$_2$ etching or by acetic chemistry HF/H$_2$O$_2$, Hot SC1, diluted SC1).

A recrystallization annealing can then be made. This annealing can be carried out at a high temperature, for example at a temperature between 700° C. and 1050° C. in order to restore the crystal structure of the portions $12_1''$, $12_1'$ of the layers 12'', 12'.

Figure 3C:
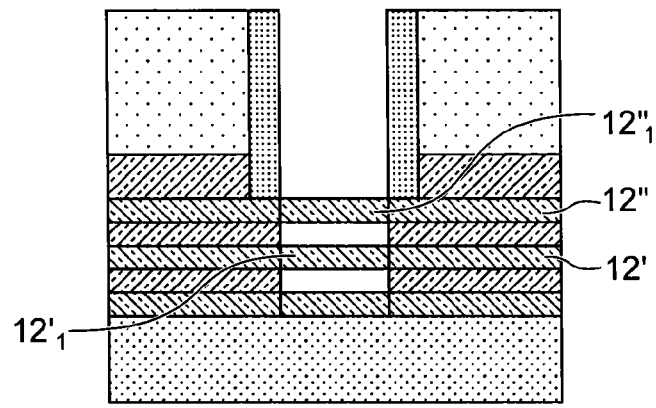

This recrystallization can be made by a specific annealing step (FIG. 3C) or can be made during the formation of the gate 50, and in particular during an annealing aiming at stabilizing the gate dielectric.

Another alternative embodiment to the method will now be described in connection with FIGS. 4A-4D.

Figure 4A:
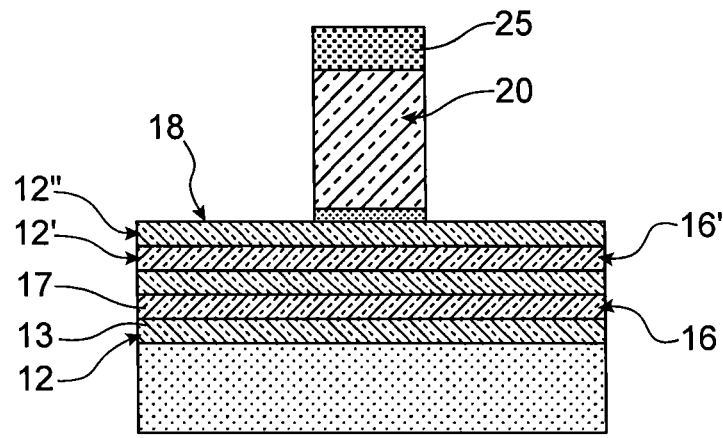
FIGS. 4A-4H illustrate a third exemplary method for making a transistor according to one embodiment of the present invention.

For this method, after making the semi-conductor structure 18 in the stack formed by alternating layers 12, 12', 12" based on the first semi-conductor material 13 and layers 16, 16' based on the second semi-conductor material 17, a sacrificial gate is made on a centre region of the semi-conductor structure 18 (FIG. 4A).

This sacrificial gate can for example be made in a similar way as the sacrificial gate 20 previously described in connection with FIGS. 2D-2E. Thus, the formation of the sacrificial gate 20 can comprise etching a gate stack through a hard mask 25.

Then, zones Z1, Z2 of the stack provided on either side of the centre region of the structure 18 on which the sacrificial gate 20 lies are made amorphous. In this example, the zones Z1, Z2 made amorphous can contain regions of the stack in which the source and drain regions of the transistor are provided. Thus, portions $16_2$, $16_3$, $16'_2$, $16'_3$ based on the second semi-conductor material 17 as well as portions $12_2$, $12_3$, $12'_2$, $12'_3$, $12''_2$, $12''_3$ based on the first semi-conductor material are amorphized. One alternative consists in only amorphizing the portions $16_2$, $16_3$, $16'_2$, $16'_3$ based on the second semi-conductor material 17 while leaving crystalline the portions $12_2$, $12_3$, $12'_2$, $12'_3$, $12''_2$, $12''_3$ based on the first semi-conductor material.

Figure 4B:
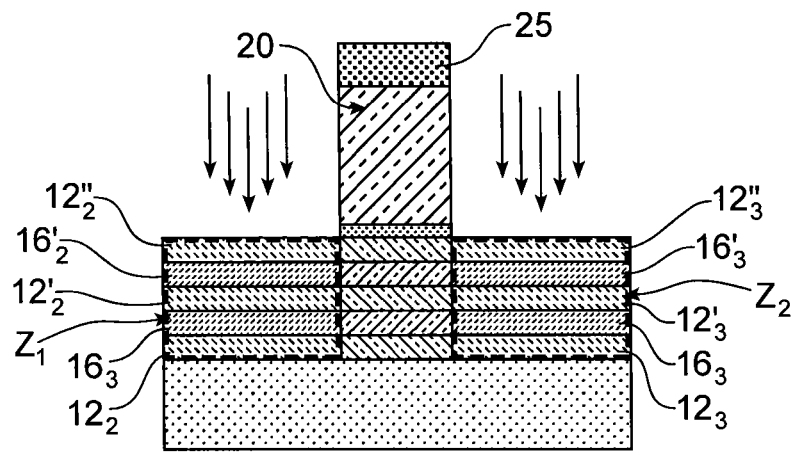

This amorphization can be made using at least one (or more) ion implantations (FIG. 4B). During the implantation, the hard mask 25 provided on the gate can act as an implantation mask so as to protect the centre region of the structure 18. The crystal structure of this centre region is thereby preserved.

Then, the portions $16_2$, $16_3$, $16'_2$, $16'_3$ are removed from the zones Z1, Z2 based on the second semi-conductor material made selectively amorphous with respect to the portions $12_2$, $12_3$, $12'_2$, $12'_3$, $12''_2$, $12''_3$ based on the first semi-conductor material.

This removal can for example be made by etching the second semi-conductor material 17 in an amorphous form. This etching is selective towards the second semi-conductor material 17 in its crystal form and towards the first semi-conductor material 13 in its crystal form and in its amorphous form.

Figure 4C:
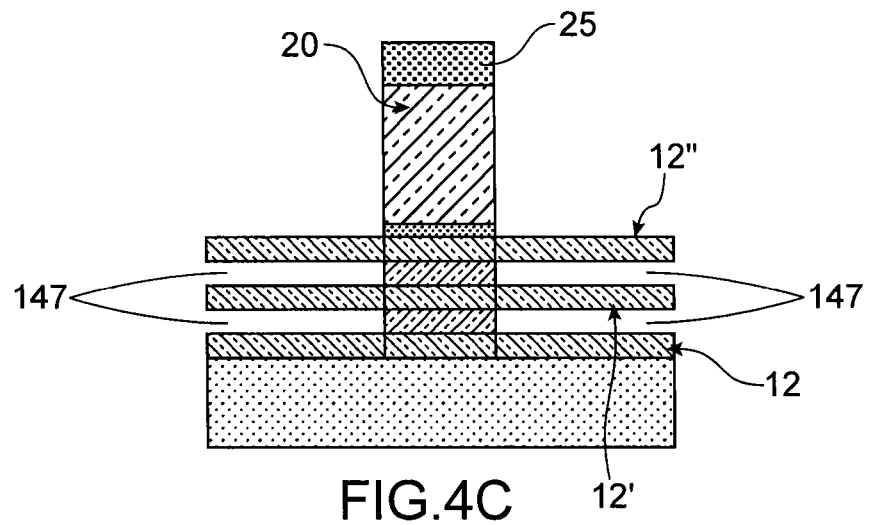

Thus, empty spaces 147 are defined between the layers 12, 12', 12" based on the first semi-conductor material 13. Because of the etching selectivity, these empty spaces 147 accurately extend up to the centre region of the structure 18 which includes parts of the layers 12, 12', 12", 16, 16' the crystal structure of which has been preserved (FIG. 4C).

Figure 4D:
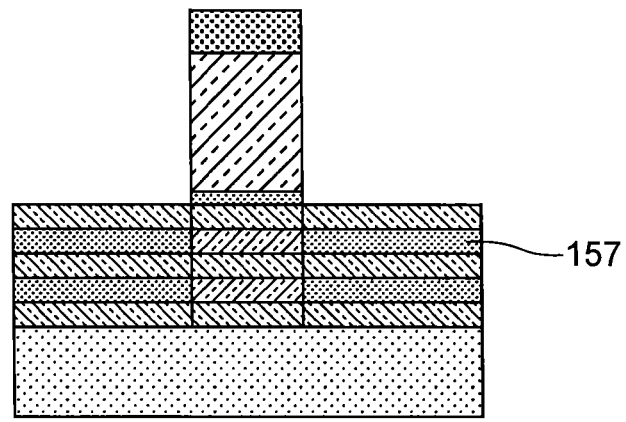

The empty spaces 147 are then filled with a given material 157, which can for example be a dielectric material (FIG. 4D). The given material is a material chosen such that the second semi-conductor material 17 can be etched with respect to this given material 157. The given material 157 can for example be based on silicon nitride ($Si_aN_b$) or silicon oxide ($SiO_2$) when the second semi-conductor material is $Si_{1-y}Ge_y$.

Figure 4E:
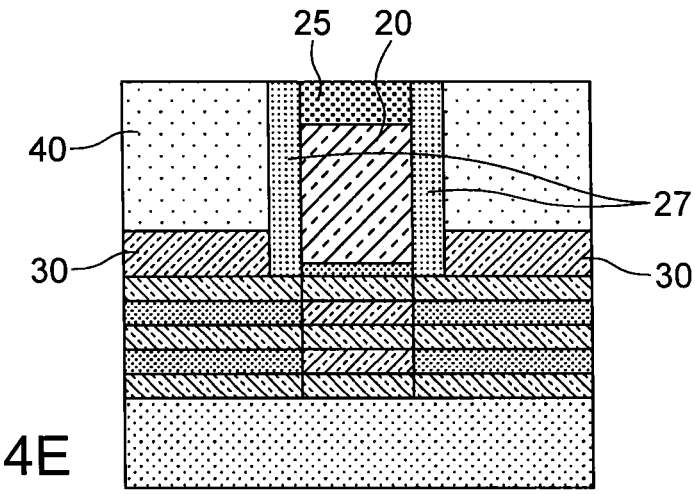

The insulating spacers 27 can then be formed against the sacrificial gate 20 and the hard mask 25. Then, the semi-conductor material 30 is formed by epitaxy growth on the source and drain blocks. The masking layer 40 is then made (FIG. 4E).

Figure 4F:
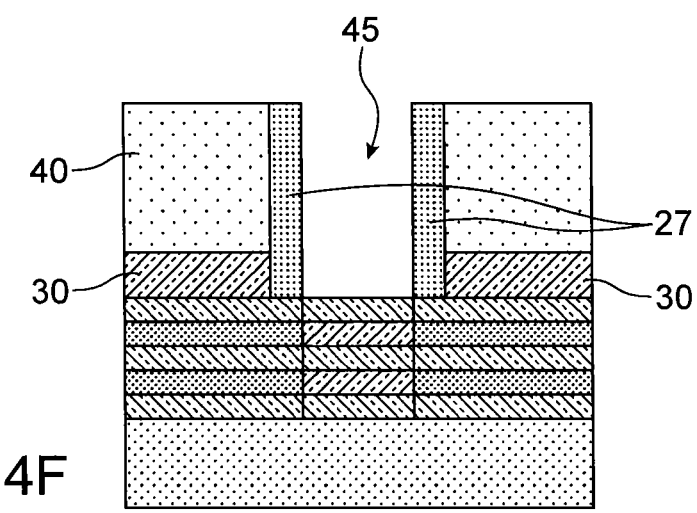

The aperture 45 is then formed by removing the hard mask 25 and the sacrificial gate 20 (FIG. 4F).

Figure 4G:
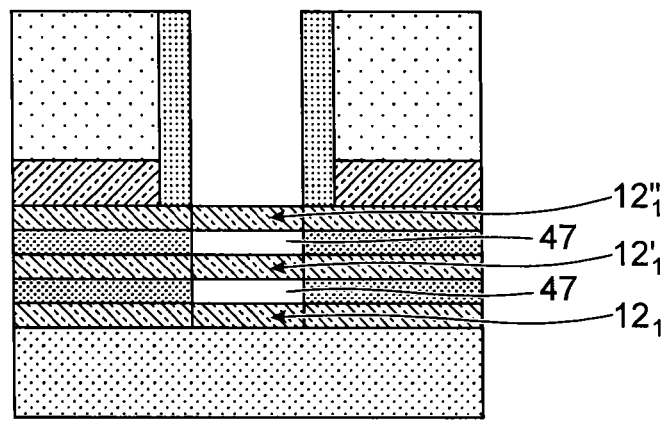

A removal of portions $16_1$, $16'_1$ from the layers 16, 16' based on the second semi-conductor material 17 located inside the aperture 45 is made (FIG. 4G).

This removal can be made this time by selectively etching the portions $16_1$, $16'_1$ based on the second semi-conductor material 17 in a crystal form towards the given material 157 in contact with these portions $16_1$, $16'_1$ and the first semiconductor material 13. Suspended nanowires or rods or membranes based on the first semi-conductor material 13 are thus released.

Such a selective etching can be made for example using a dry etching (HCl, HBr/He/$O_2$ or HBr/$Cl_2$ or $CF_4$/HBr/$Cl_2$ etching) or wet etching (acetic chemistry HF/$H_2O_2$, Hot SC1, diluted SC1), when the second material 17 which is removed in the aperture 45 is based on silicon germanium and when the materials 13 and 157 are respectively Si and silicon nitride (or silicon oxide SiO2). Thus, in the aperture 45, semi-conductor portions $12_1$, $12_1'$, $12_1''$ based on the first semi-conductor material 13 some of which $12_1'$, $12_1''$ are suspended are obtained.

Figure 4H:
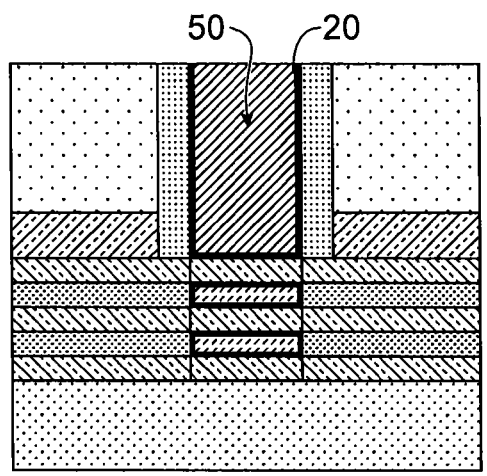

A recrystallization annealing, enabling the crystal structure of the portions $12_2$, $12_3$, $12'_2$, $12'_3$, $12''_2$, $12''_3$ based on the first semi-conductor material to be restored can then be made prior to forming a gate 50, or during the formation of this coating gate 50 in the aperture 45 and arranged around the semi-conductor portions $12_1$, $12_1'$, $12_1''$ (FIG. 4H).

According to an alternative to either of the exemplary methods which have been previously described in connection with FIGS. 3 and 4, the transistor can be provided in a stack formed by alternating different semi-conductor materials different from those given in the previous examples.

A method as previously described is particularly applicable to the implementation of MOSFET transistors with a channel structure formed by nanowires distributed on several levels and with a coating gate. This gate can in particular be formed after releasing the nanowires (approach called "gate last").

A transistor obtained using a method as previously described can be included for example in a high performance and low consumption logic integrated circuit, or for example in a memory, in particular in a NAND Flash type memory, a molecular memory, or for example in a sensor such as a load sensor.

The invention claimed is:

1. A method for making a transistor formed in a stack of superimposed semi-conductor layers, the method comprising:
   a) providing on a substrate, at least one semi-conductor structure formed by a stack comprising plural layers based on at least one first semi-conductor material and plural layers based on at least one second semi-conductor material different from the first semi-conductor material, the stack being formed by an alternation of layers based on the first material and layers based on the second material,
   b) making amorphous, using one or more implantations, at least one zone of the structure, the zone made amorphous comprising respective portions of plural layers based on the second semi-conductor material,
   c) selectively etching the second semi-conductor material made amorphous towards the first semi-conductor material, so as to remove said respective portions of said plural layers.

2. The method according to claim 1, wherein the zone made amorphous in b) is located in a centre region of the structure in which a channel region of the transistor is able to be formed,
   the method further comprising, after a) and prior to forming a masking onto the stack, the masking comprising an aperture revealing a centre region of the structure,
   the implantation(s) in b) being made through the aperture of the masking, such that the zone made amorphous is located in the aperture whereas the crystal structure of parts of the layer(s) based on the second semi-conductor material located outside the aperture is preserved,
   the removal of the portions being then performed in c) by selectively etching the second semi-conductor material in an amorphous form towards the layers based on the first semi-conductor material and the parts of the layer (s) based on the second semi-conductor material, the crystal structure of which has been preserved in b),
   and then after c), forming a gate in the aperture.

3. The method according to claim 2, wherein the amorphization in b) is a selective amorphization of the portions based on the second semi-conductor material towards the layers based on the first semi-conductor material.

4. The method according to claim 3, wherein the first semi-conductor material is based on Si or $Si_{1-x}Ge_x$ (with x>0), the second semi-conductor material being based on $Si_{1-y}Ge_y$ with 0≤x<y.

5. The method according to claim 2, wherein the amorphization in b) is a partial amorphization of the centre region of the structure so as to make amorphous one or more portions of one or more layers based on the second semi-conductor material and further one or more given layers based on the first semi-conductor material while preserving the crystal structure of at least one layer based on the first semi-conductor material.

6. The method according to claim 5, comprising after removing the portions in c), thermal annealing at least once, so as to recrystallize the given layers based on the first semi-conductor material.

7. The method according to claim 2, wherein the masking is made prior to b) by forming a sacrificial gate arranged on the centre region of the structure, and then forming a masking layer against the sacrificial gate so as to form the masking, and then forming the aperture in the masking by removing the sacrificial gate.

8. The method according to claim 1, wherein the zone made amorphous is located in regions of the structure in which source and drain regions of the transistor are able to be formed, the implantation(s) being made in b) so as to preserve the crystal structure of a centre region of the structure in which a channel region of the transistor is able to be made,
   the removal in c) of the portions being then performed by selectively etching the second semi-conductor material in an amorphous form towards the layers based on the first semi-conductor material and parts of the layer(s) based on the second semi-conductor material located in the centre region and the crystal structure of which has been preserved.

9. The method according to claim 8, wherein the removal of the portions results in forming empty spaces, the method further comprising:
   depositing a given material in the empty spaces,
   forming a masking provided with an aperture revealing the centre region of the structure,
   removing parts based on the second semi-conductor material in the aperture by selectively etching the second semi-conductor material towards the first semi-conductor material and the given material.

10. The method according to claim 9, wherein in b), a sacrificial gate is arranged facing the centre region, the method further comprising forming a masking layer against the sacrificial gate so as to form the masking, the aperture being made by removing the sacrificial gate.

11. The method according to claim 8, further comprising after c), thermal annealing at least once, so as to recrystallize the layers based on the first semi-conductor material.

12. The method according to claim 11, wherein the stack comprises alternating layer(s) based on $Si_{1-x}Ge_x$, and layers based on $Si_{1-y}Ge_y$, with $0 \leq x < y$.

13. The method according to claim 12, wherein the stack is formed on a SOI or SiGeOI type substrate.

14. A method for making a transistor formed in a stack of superimposed semi-conductor layers, the method comprising:
   a) providing on a substrate, at least one semi-conductor structure formed by a stack comprising alternating layer(s) based on at least one first semi-conductor material and layer(s) based on at least one second semi-conductor material different from the first semi-conductor material,
   b) making amorphous, using one or more implantations, at least one zone of the structure, the zone made amorphous comprising one or more portions of one or more layers based on the second semi-conductor material, the zone made amorphous is located in regions of the structure in which source and drain regions of the transistor are able to be formed, the implantation(s) being made in b) so as to preserve the crystal structure of a centre region of the structure in which a channel region of the transistor is able to be made,
   c) removing the portions by selectively etching the second semi-conductor material made amorphous towards the first semi-conductor material, the removal of the portions being then performed by selectively etching the second semi-conductor material in an amorphous form with respect to the layers based on the first semi-conductor material and parts of the layer(s) based on the second semi-conductor material located in the centre region and the crystal structure of which has been preserved.

15. A method for making a transistor formed in a stack of superimposed semi-conductor layers, the method comprising:
   a) forming at least a semi-conductor structure comprising a stack with semi-conductor layers based on at least a first semi-conductor material and plural semi-conductor layers based on at least a second semi-conductor material different from the first semi-conductor material, the stack being formed by an alternation of layers based on the first semi-conductor material and layers based on the second semi-conductor material,
   b) selectively implanting a zone of said stack so as to render amorphous in said zone layers based on the second semi-conductor material while retaining in said zone the crystalline structure of layers based on the first semi-conductor material,
   c) selectively etching of the second semi-conductor material layers so as to remove the second semi-conductor material in said zone while retaining the first semi-conductor material in said zone.

* * * * *